United States Patent [19]

Shou et al.

[11] Patent Number: 5,686,861
[45] Date of Patent: Nov. 11, 1997

[54] FILTER CIRCUIT

[75] Inventors: Guoliang Shou; Sunao Takatori; Makoto Yamamoto, all of Tokyo, Japan

[73] Assignees: Yozan Inc., Tokyo; Sharp Kabushiki Kaisha, Osaka, both of Japan

[21] Appl. No.: 630,505

[22] Filed: Apr. 10, 1996

[30] Foreign Application Priority Data

Apr. 12, 1995 [JP] Japan .................... 7-111321

[51] Int. Cl.$^6$ .................... H03K 5/00; H04B 1/10
[52] U.S. Cl. .................... 327/552; 327/558; 327/559; 327/311; 327/344; 327/336; 333/172; 330/294; 330/107
[58] Field of Search .................... 327/551, 552, 327/555, 556, 557, 558, 559, 560, 561, 311, 336, 344, 544; 333/172; 330/294, 306, 107

[56] References Cited

U.S. PATENT DOCUMENTS 3,857,104 12/1974 Sacks .................... 327/558

OTHER PUBLICATIONS

Imada et al., "Practical Analog Filter Designing Method", CQ Shuppan Kabushiki Kaisha, 1989, p. 9, Figure 1.1, p. 34, Figure 2.1, p. 43, Figure 2.5.
"Free Filter for Serial Data", D.S. Fenna, Electronic Product Design, Mar. 1982, p. 22.

Primary Examiner—Timothy P. Callahan
Assistant Examiner—Dinh T. Le
Attorney, Agent, or Firm—Cushman Darby & Cushman IP Group of Pillsbury Madison & Sutro, LLP

[57] ABSTRACT

A filter circuit that consumes very little electric power. The active filter is a linear inverter constructed by 1) an inverting amplifying portion composed of an odd number of MOS inverters serially connected, 2) a grounded capacitance connected between an output of the inverting amplifying portion and ground, 3) a balancing resistance having a pair of resistances for connecting an output of one of the MOS inverters, other than the last MOS inverter, to the supply voltage and the ground, respectively, and 4) a feedback impedance for connecting the output and input of the inverting amplifying portion. A coupling capacitance is connected to the input of the linear inverter and a plurality of filter circuits are connected to an input of the coupling capacitance.

11 Claims, 3 Drawing Sheets

1

FILTER CIRCUIT

FIELD OF THE INVENTION

The present invention is related to a filter circuit, and in particular, to a filter circuit that consumes very little power.

BACKGROUND OF THE INVENTION

Conventional active filters typically include an operational amplifier to which an input impedance and a feedback impedance are connected. Generally, an operational amplifier is a device driven by electrical current, and consumes a lot of electric power.

SUMMARY OF THE INVENTION

An object of the present invention is to solve the above conventional problems and to provide a filter circuit that consumes very little electric power.

A filter circuit of the present invention is a linear inverter consisting of 1) an inverting amplifying portion composed of an odd number of MOS inverters serially connected, 2) a grounded capacitance connected between an output of the inverting amplifying portion and the ground, 3) a balancing resistance having a pair of resistances for connecting an output of one of the MOS inverters, other than the last MOS inverter, between the supply voltage and ground, respectively, and 4) a feedback impedance for connecting the output and input of the inverting amplifying portion. A coupling capacitance is connected to the input of the linear inverter and a plurality of filter circuits are connected to an input of the coupling capacitance.

According to the present invention, a filter circuit includes, instead of a conventional operational amplifier, an inverting amplifying portion consisting of an odd number of MOS inverters serially connected so as to be driven by a voltage. The amount of electrical power consumed by the filter circuit is thereby reduced.

PREFERRED EMBODIMENT OF THE PRESENT INVENTION

Hereinafter, the first embodiment of a filter circuit according to the present invention is described with reference to the drawings.

Figure 1:
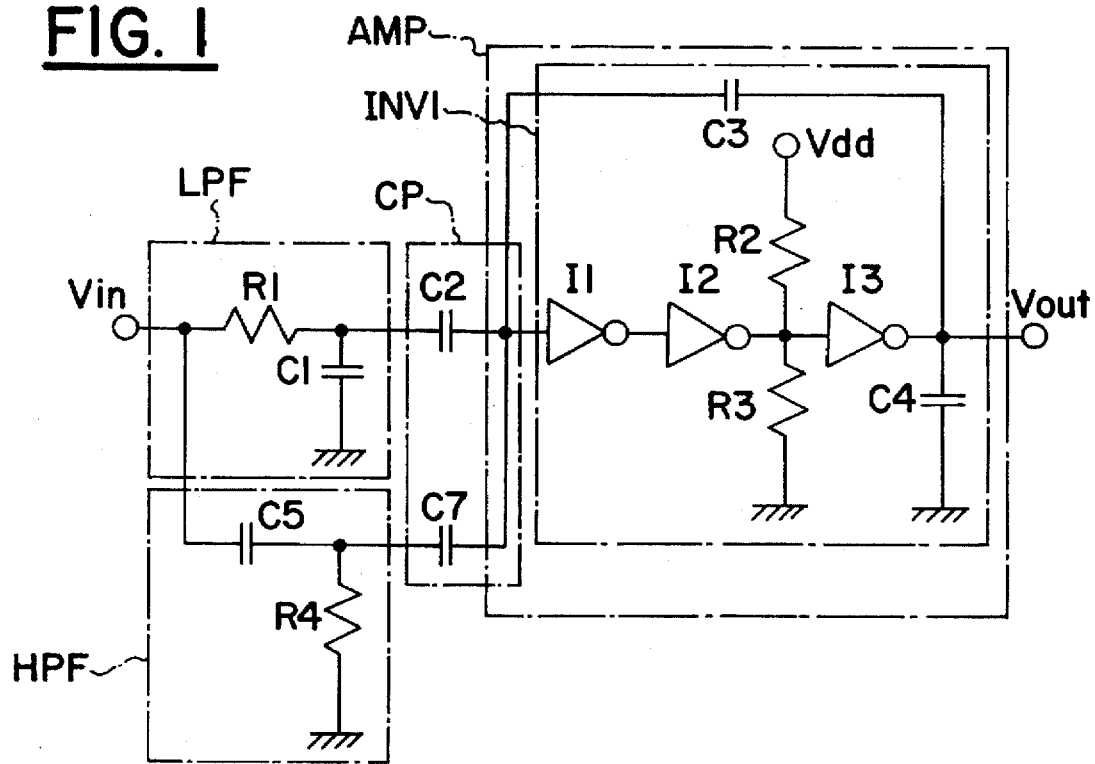
FIG. 1 shows the circuit of the first embodiment of the filter circuit according to the present invention.

In FIG. 1, a filter circuit includes a low pass filter LPF and high pass filter HPF which are connected in parallel. Outputs of these filter circuits are added by a coupling capacitance capacitance CP the output of which is input to an inverting amplifier INV1.

Inverting amplifier INV1 consists of an odd number of MOS inverters I1, I2 and I3, which are serially connected. A grounded capacitance C4 is connected between an output of the last stage inverter I3 and ground. A balancing resistance consisting of a pair of resistances R2 and R3 is provided for connecting an output of MOS inverter I2 to the supply voltage Vdd and ground, respectively. The output of the inverting amplifying portion is connected through a feedback capacitance C3 to its input. It outputs an inverted output Vout. The voltage level of this output is equal to the output of CP because the total gain of inverters I1, I2 and I3 is high and their output is fed back to their input.

Figure 2:
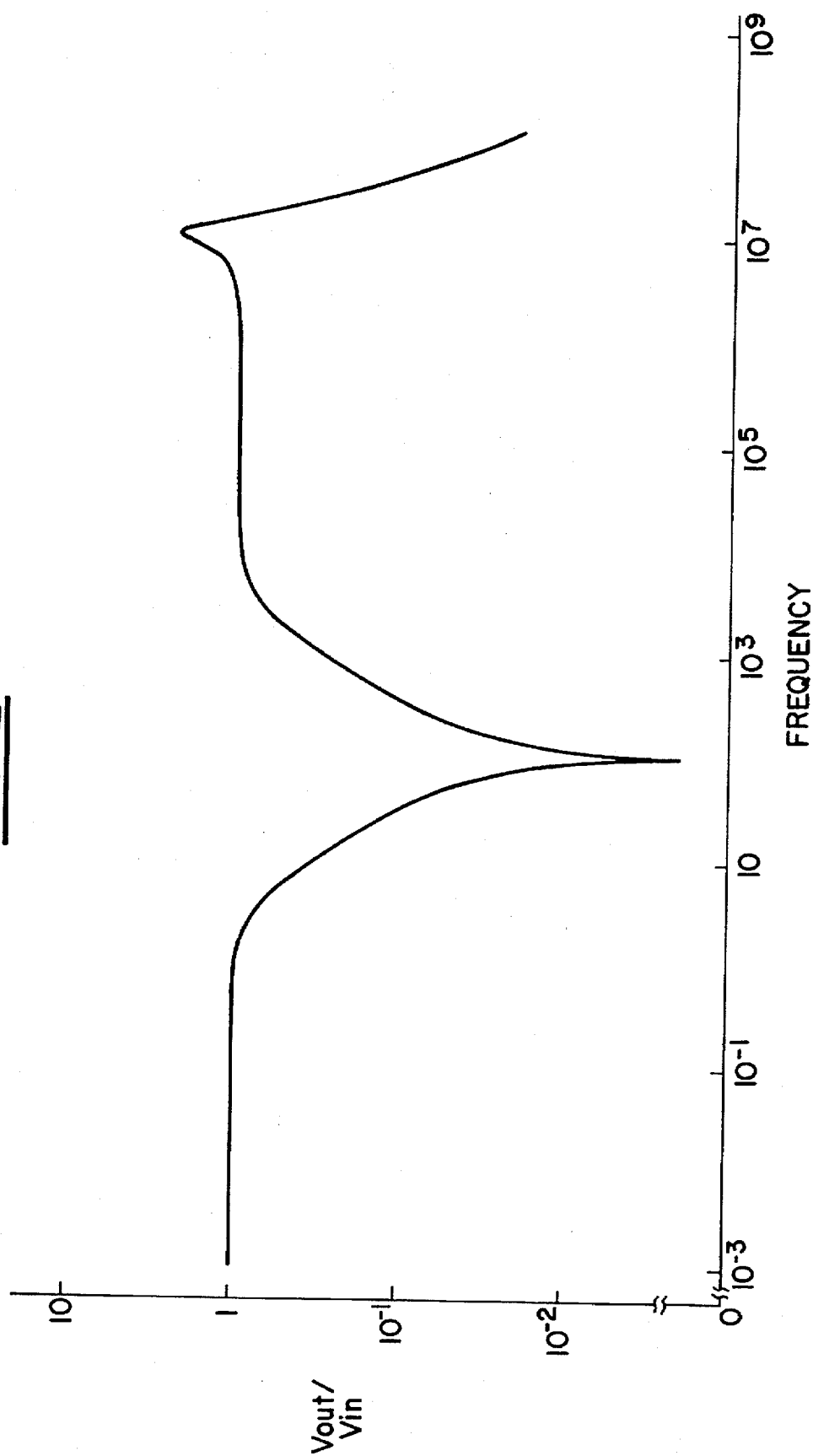
FIG. 2 shows a graph of the frequency characteristics in the first embodiment.

FIG. 2 shows frequency characteristics of the filter circuit above. A band elimination filter is constructed by lowering the gain in an overlapping stopband (or shut down frequency area) of both high pass and low pass filters. The band of lowered gain is from 10 Hz to 1 kHz, as can be seen in FIG. 2.

Low pass filter LPF consists of resistance R1 connected to an input voltage Vin, and a capacitance C1 connected between an output of the resistance R1 and ground. A transfer function T(s) of LPF is shown in the formula (1).

$$T(s) = \frac{\frac{1}{C1R1}}{s + \frac{1}{C1R1}} \quad (1)$$

High pass filter HPF consists of a capacitance C5 connected to the input voltage Vin, and a resistance R4 connected between an output of the capacitance C5 and ground. A transfer function T(s) HPF is shown in the formula (2).

$$T(s) = \frac{s}{s + \frac{1}{C5R4}} \quad (2)$$

The transfer function of the whole filter circuit can be obtained as a sum of these transfer functions as in formula (3).

$$T(s) = \frac{\frac{1}{C1R1}}{s + \frac{1}{C1R1}} + \frac{s}{s + \frac{1}{C5R4}} = \frac{s^2 + \frac{1}{C1R1} s + \frac{1}{C1R1} \cdot \frac{1}{C5R4}}{s^2 + \left(\frac{1}{C1R1} + \frac{1}{C5R4}\right)s + \frac{1}{C1R1} \cdot \frac{1}{C5R4}} \quad (3)$$

As mentioned above, when a band elimination filter using the amplifying circuit comprised of MOS inverters is constructed, consumption of electric power can be drastically reduced. Also, various frequency characteristics can be realized by integrating a plurality of filter circuits by means of a coupling capacitance.

Figure 3:
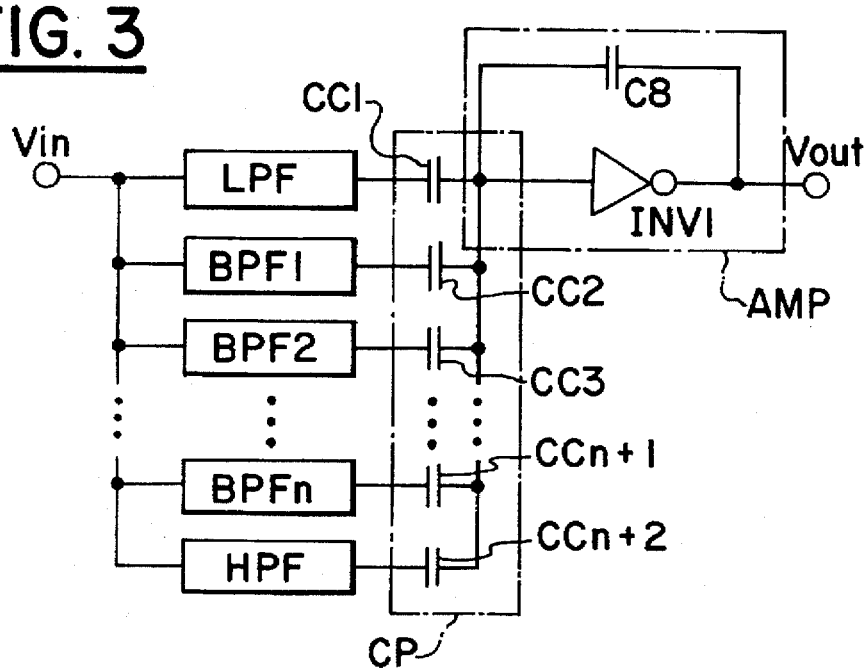
FIG. 3 shows a block diagram of the second embodiment of the filter circuit.

A second embodiment of the filter circuit according to the invention is shown in FIG. 3, wherein a plurality of filters include a low pass filter LPF, band pass filters BPF1, BPF2, ... and BPFn, and a high pass filter HPF, are connected in parallel to a coupling capacitance CP, and the output of the coupling capacitance is input to the inverting amplifier AMP. The coupling capacitance CP consists of a plurality of capacitances CC1 to CCn+2 parallelly connected. An output of the coupling capacitance CP is input to an inverting amplifier AMP similar to the coupling capacitance in FIG. 1. The inverting amplifier AMP consists of three stage serial inverter INV1, the input and output of which are connected through a feedback capacitance C8 with each other for preventing sending.

Figure 4:
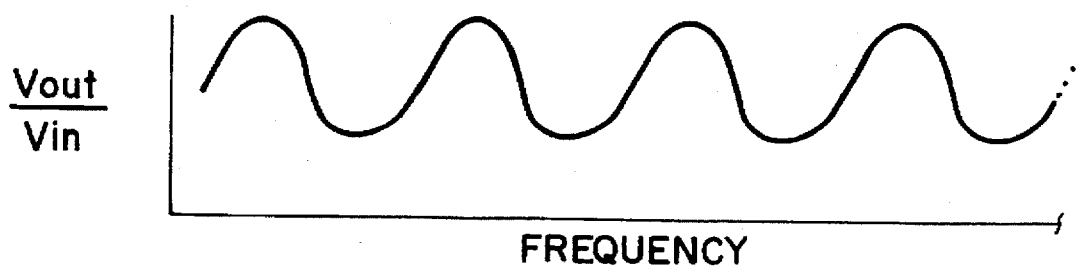
FIG. 4 shows a graph of the frequency characteristics in the second embodiment.

The coupling capacitance CP inputs each of the outputs from the filter circuits and outputs their sum to AMP. AMP outputs an output voltage Vout of the same amplitude as its input voltage, inverted. Frequency characteristics of the filter circuit in FIG. 3 are shown in FIG. 4. It has characteristics of an aggregation of passbands successively appearing through filters LPF, BPF1 to BPFn, and HPF.

When transfer functions of LPF and HPF are T1(s) and Tn+2(s) and transfer functions of band pass filters BPF1 to BPFn are T2(s) to Tn+1(s), a composite transfer function Tt(s) of the total circuit in FIG. 3 is defined as in formula (4).

$$T(s) = \sum_{i=1}^{n+2} Ti(s) \quad (4)$$

According to the present invention, a filter circuit is constructed as a linear inverter consisting of 1) a inverting amplifying portion composed an odd number of MOS inverters serially connected, 2) a grounded capacitance connected between an output of the inverting amplifying portion and ground, 3) a balancing resistance having a pair of resistances connecting an output of one of the MOS inverters, other than the last MOS inverter, to the supply voltage and ground, respectively, and 4) a feedback impedance for connecting the output and input of the inverting amplifying portion. A coupling capacitance is connected to the input of the linear inverter and a plurality of filter circuits are connected to an input of the coupling capacitance. Therefore, it is possible to realize various frequency characteristics with low electric power.

What is claimed is:

1. A filter circuit comprising:
   i) an input terminal;
   ii) an inverting amplifier consisting of an odd number of MOS inverters serially connected,
   iii) a grounded capacitance connected between an output of said inverting amplifier and ground,
   iv) a balancing resistance consisting of a pair of resistances that couple an output of one of said MOS inverters, other than a last one of said MOS inverters, to a supply voltage and ground, respectively,
   v) a feedback impedance coupled between said output of said inverting amplifier and an input of said inverting amplifier,
   vi) a coupling capacitance coupled to said input of said inverting amplifier, and
   vii) a plurality of filters coupled between an input of said coupling capacitance and said input terminal.

2. A filter circuit as claimed in claim 1 wherein said plurality of filters includes a first order low pass filter and a first order high pass filter.

3. A filter circuit as claimed in claim 2, wherein said low pass filter comprises:
   a) a resistance connected to said input terminal, and
   b) a capacitance connected between an output of said resistance and ground.

4. A filter circuit as claimed in claim 2, wherein said high pass filter comprises:
   a) a capacitance connected to said input terminal, and
   b) a resistance connected between an output of said capacitance and ground.

5. A filter circuit as claimed in claim 1, wherein said plurality of filters includes:
   a plurality of band pass filters each having a respective passband,
   a low pass filter having a cutoff frequency lower than any respective passband of said band pass filters, and
   a high pass filter having a cutoff frequency higher than any respective passband of said band pass filters.

6. A filter circuit as claimed in claim 5, wherein said respective passbands of said band pass filters are successively spaced between said cutoff frequency of said low pass filter and said cutoff frequency of said high pass filter.

7. A filter circuit comprising:
   i) an input terminal,
   ii) a serial inverter consisting of an odd number of MOS inverters,
   iii) a feedback capacitor coupled between an output of said serial inverter and an input of said serial inverter,
   iv) a coupling capacitance coupled to said input of said serial inverter, and
   v) a plurality of filters coupled between an input of said coupling capacitance and said input terminal.

8. A filter circuit as claimed in claim 7 wherein said plurality of filter circuits includes a first order low pass filter and a first order high pass filter.

9. A filter circuit as claimed in claim 8, wherein said low pass filter comprises:
   a) a resistance connected to said input of said filter circuit, and
   b) a capacitance connected between an output of said resistance and ground.

10. A filter circuit as claimed in claim 8, wherein said high pass filter comprises:
    a) a capacitance connected to said input of said filter circuit, and
    b) a resistance connected between an output of said capacitance and ground.

11. A filter circuit as claimed in claim 7, wherein said plurality of filter circuits includes:
    a plurality of band pass filters each having a respective passband,
    a low pass filter having a cutoff frequency lower than any respective passband of said band pass filters, and
    a high pass filter having a cutoff frequency higher than any respective passband of said band pass filters.

* * * * *